(12) United States Patent
Fu et al.

(10) Patent No.: US 8,866,509 B1
(45) Date of Patent: Oct. 21, 2014

(54) FLIP-FLOP ARRAY WITH OPTION TO IGNORE CONTROL SIGNALS

(71) Applicant: Xilinx, Inc., San Jose, CA (US)

(72) Inventors: Robert I. Fu, Saratoga, CA (US); Chi M. Nguyen, San Jose, CA (US); James M. Simkins, Park City, UT (US); Brian C. Gaide, Erie, CO (US); Brian D. Philoksky, Longmont, CO (US)

(73) Assignee: Xilinx, Inc., San Jose, CA (US)

( * ) Notice: Subject to any disclaimer, the term of this patent is extended or adjusted under 35 U.S.C. 154(b) by 67 days.

(21) Appl. No.: 13/842,664

(22) Filed: Mar. 15, 2013

(51) Int. Cl.
*H03K 19/173* (2006.01)

(52) U.S. Cl.
CPC .................................. *H03K 19/173* (2013.01)
USPC ............................................... 326/46; 326/38

(58) Field of Classification Search
CPC ............. H03K 19/17716; G11C 7/106; G06F 17/5054
USPC ................................................ 326/37–41, 46
See application file for complete search history.

(56) References Cited

U.S. PATENT DOCUMENTS 5,065,052 A * 11/1991 Sakagami et al. ............... 327/19
2006/0104124 A1* 5/2006 Padaparambil .......... 365/189.05

OTHER PUBLICATIONS

Altera Corp., *Flex 10K*, DS-F10K-4.2, Jan. 2003, pp. 1-128, ver. 4.2, Altera Corp., San Jose, California, USA.
Altera Corp., *Flex 8000*, DS-F8000-11.1, Jan. 2003, pp. 1-62, ver. 11.1, Altera Corp., San Jose, California, USA.

* cited by examiner

*Primary Examiner* — Don Le
(74) *Attorney, Agent, or Firm* — Kin-Wah Tong

(57) ABSTRACT

Integrated circuits having groups of flip-flops with the option to ignore control signals are disclosed. For example, an integrated circuit comprises a first group and a second group of flip-flops that share a common reset signal, and a first selection unit for selecting a first output from among the common reset signal and a logical low signal to be sent to the second group of flop-flops. A selection of the logical low signal is for preventing the common reset signal from being applied to the flip-flops in the second group. The integrated circuit may also include a second selection unit for selecting a second output from among the common reset signal and a logical low signal to be sent to the first group of flop-flops. A selection of the logical low signal is for preventing the common reset signal from being applied to the flip-flops in the first group.

20 Claims, 4 Drawing Sheets

US 8,866,509 B1

FLIP-FLOP ARRAY WITH OPTION TO IGNORE CONTROL SIGNALS

TECHNICAL FIELD

This invention relates generally to configurable flip-flop arrays for integrated circuits.

BACKGROUND

Integrated circuits often include vast arrays of logic gates. Dedicated integrated circuits (ICs) may provide the smallest chip-size for various applications. For instance, only the minimum number of required gates, interconnects and other components are required according to the design. However, for many small volume operations or for testing of various circuit designs, the fabrication of dedicated integrated circuits may be too costly as well as too time consuming. As an alternative, various programmable integrated circuit (ICs), such as field-programmable gate arrays (FPGAs), are popular for testing designs and for lower volume device production, as well as for providing flexibility to configure and reconfigure embedded components. Within programmable ICs such as FPGAs, components may be grouped into various blocks or logic units, such as configurable logic blocks (CLBs) and/or slices. For example, each slice may contain a number of look-up tables (LUTs), flip-flops, storage elements, carry logic elements, and so forth, and each configurable logic block may be composed of several slices.

SUMMARY

The present disclosure provides an integrated circuit including a first group of flip-flops and a second group of flip-flops. The flip-flops in the first group and the flip-flops in the second group share a common reset signal. The integrated circuit further includes a first selection unit for selecting a first output from among the common reset signal and a logical low signal to be sent to the second group of flop-flops. A selection of the logical low signal is for preventing the common reset signal from being applied to the flip-flops in the second group.

In various embodiments: the first selection unit is further for selecting the first output based upon a reset ignore signal; the first group and the second group comprise a same number of flip-flops; the flip-flops in the first group share a first common clock enable signal and the flip-flops in the second group share a second common clock enable signal; the flip-flops in the first group and the flip-flops in the second group share a common clock enable signal; the flip-flops in the first group and the flip-flops in the second group share a common clock signal; a second selection unit is for selecting a second output from among the common reset signal and a logical low signal to be sent to the first group of flop-flops, wherein a selection of the logical low signal is for preventing the common reset signal from being applied to the flip-flops in the first group; the integrated circuit further comprises a plurality of look-up tables; each of the flip-flops in the first group and each of the flip-flops in the second group has at least one input port for receiving at least one input from at least one of the plurality of look-up tables; the integrated circuit further comprises a configuration memory; the first selection unit is further for selecting the first output based upon a reset ignore signal stored in the configuration memory; the first group and the second group comprise components of a slice of the integrated circuit; and the integrated circuit is a field-programmable gate array.

The present disclosure also provides a further integrated circuit including a first group of flip-flops and a second group of flip-flops. The flip-flops in the first group and the flip-flops in the second group share a common clock enable signal. The integrated circuit further includes a first selection unit for selecting a first output from among the common clock enable signal and a logical high signal to be sent to the second group of flip-flops. A selection of the logical high signal is for preventing the common clock enable signal from being applied to the flip-flops in the second group.

In various embodiments: the first selection unit is further for selecting the first output based upon a clock enable ignore signal; the flip-flops in the first group share a first common reset signal and the flip-flops in the second group share a second common reset signal; the flip-flops in the first group and the flip-flops in the second group share a common reset signal; the flip-flops in the first group and the flip-flops in the second group share a common clock signal; and a second selection unit is for selecting a second output from among the common clock enable signal and a logical high signal to be sent to the first group of flip-flops, wherein a selection of the logical high signal is for preventing the common clock enable signal from being applied to the flip-flops in the first group.

Still another integrated circuit is disclosed that comprises a first group of flip-flops, a second group of flip-flops, and a selection unit. The selection unit is controllable to disable one of a clock enable signal or a reset signal to the second group of flip-flops. The clock enable signal or the reset signal is shared by the first group of flip-flops or the second group of flip-flops.

BRIEF DESCRIPTION OF THE DRAWINGS

The accompanying drawings show exemplary circuits and methods in accordance with one or more aspects of the disclosure; however, the accompanying drawings should not be taken to limit the disclosure to the examples shown, but are for explanation and understanding only.

To facilitate understanding, identical reference numerals have been used, where possible, to designate identical elements that are common to the figures.

DETAILED DESCRIPTION

The present disclosure relates generally to devices having certain groups of flip-flops that are configurable to ignore control signals and methods for manufacturing such devices. For example, one or more groups of flip-flops may have an option to ignore one or more control signals, while the control signals are shared by a larger set of flip-flops. In one example, the present disclosure can be implemented within an integrated circuit (IC), e.g., a programmable IC, a programmable logic device (PLD), a dedicated IC, a field programmable gate array (FPGA), and the like.

Figure 1:
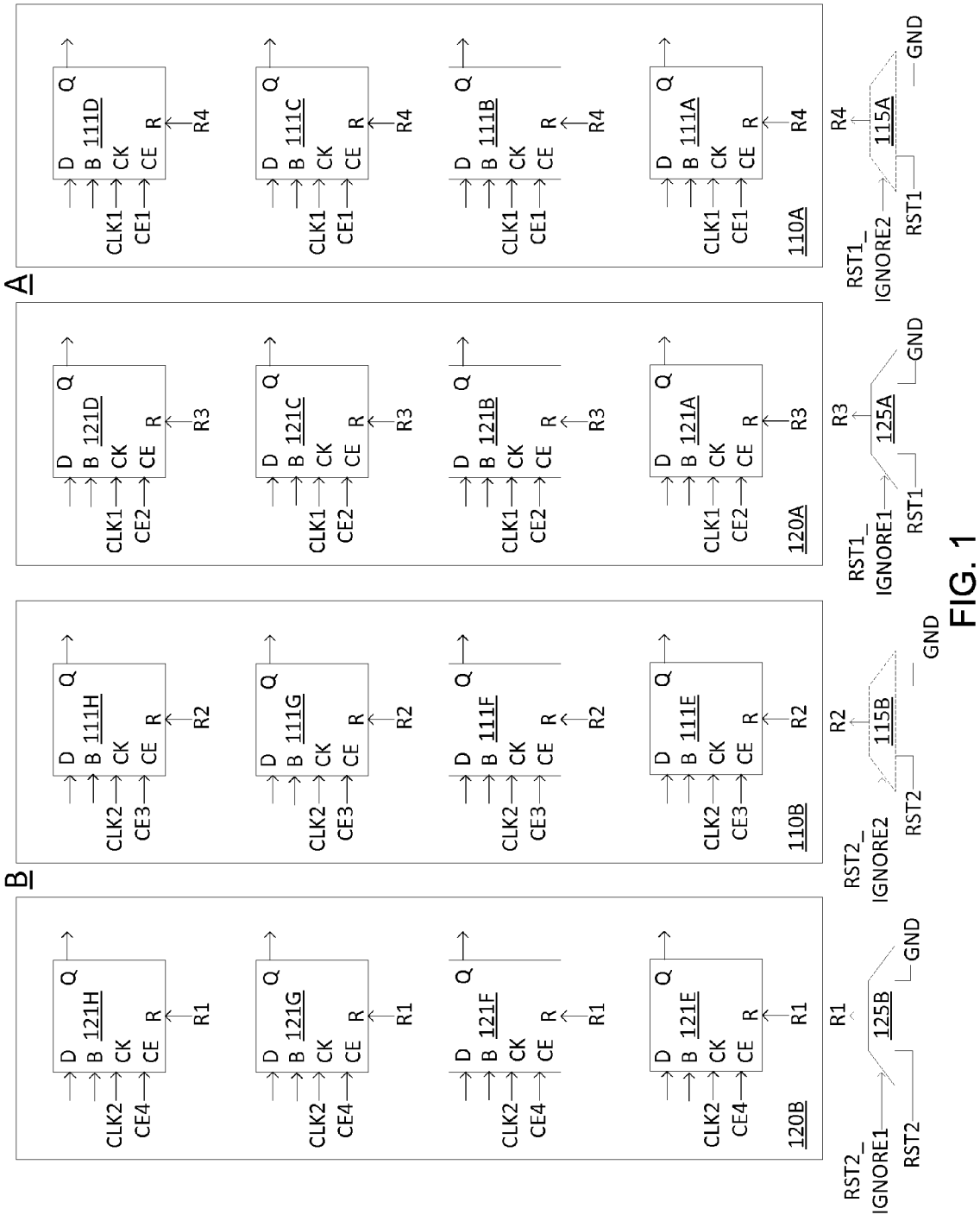
FIG. 1 illustrates a block diagram of an integrated circuit.

FIG. 1 illustrates an exemplary circuit 100. For example, circuit 100 may comprise a portion of a dedicated IC, a FPGA slice, and so forth. In one instance, circuit 100 includes a number of groups of flip-flops, e.g., D flip-flops. Circuit 100 includes four groups 110A, 120A, 110B and 120B. However, in other instances, more or less groups of flip-flops may be provided. In one embodiment, one or more of the groups may be configured as latches. For example, flip-flop 121A may continue to function as a D flip-flop while flip-flop 111A may instead be configured to function as a latch. In one example, the flip-flops in each of the groups may comprise positive or negative edge triggered flip-flops. In another example, the flip-flops in each of the groups may comprise different types of flip-flops, e.g., J-K flip-flops, SR flip-flops, or other types of flip-flops.

As shown in FIG. 1, the groups are further organized into larger sets "A" and "B". In one instance, sets "A" and "B" have independent clock signals. For example, groups 110A and 120A in set "A" share clock 1 (CLK1), while groups 110B and 120B in set "B" share clock 2 (CLK2). Within each of the groups are a number of flip-flops. In FIG. 1, each group has four flip-flops. For example, group 110A includes flip-flops 111A-111D, group 120A includes flip-flops 121A-121D, group 110B includes flip-flops 111E-111H, and group 120B includes flip-flops 121E-121H. In some cases, more or less flop-flops may be included within each group. In addition, each of the groups includes a same number of flip-flops or may have different numbers of flip-flops.

Each flip-flop has a number of inputs for control signals as well as for data input and data output signals. For example, flip-flop 111A includes a data port (D) for receiving incoming data, a clock port (CK) for receiving a clock signal, a clock enable (CE) port for receiving a clock enable signal, a reset port (R) for receiving a reset signal, a bypass input port (B) for receiving bypass input data, and an output port (Q) for a data output. In one example, the circuit 100 may also includes a plurality of look-up tables (LUTs) connected to a respective plurality of flip-flop data input ports (D) for providing input data.

Turning to set A as an example, both groups 110A and 120A share a common clock signal CLK1. It should be noted that as described herein, the sharing of a signal means that one or more devices/components are coupled to a common signal source. For instance, each of the flip-flops 111A-111D in group 110A and flip-flops 121A-121D in group 120A may be coupled by way of traces, vias, or similar connections to a source of the common clock signal CLK1. In addition, as shown in FIG. 1, the flop-flips 111A-111D in group 110A share a common clock enable signal (CE1), while the flip-flops 121A-121D in group 120A share a different clock enable signal (CE2). Alternatively, groups 110A and 120A may both share a single clock enable signal. As also shown in FIG. 1, flip-flops 111A-111D in group 110A can be controlled by a common reset signal (RST1). In addition, flip-flops 121A-121D in group 120A may also be controlled by RST1. Thus, flip-flops 121A-121D also share the common reset signal (RST1). However, group 120A may also be configured, or programmed to ignore the RST1 signal. In particular, for group 120A, circuit 100 further comprises a selection unit 125A, e.g., a multiplexer for selecting among RST1 and a logical low, or ground signal. For example, a configuration or management signal "reset ignore" (RST1_IGNORE1) provides a signal to the selection unit 125A to choose which of the two inputs to pass as an output R3. For instance, if RST1_IGNORE1 is a logical low, e.g., a zero "0", then the selection unit 125A may select RST1. On the other hand, if RST1_IGNORE1 is a logical high, e.g., a one "1", then the ground signal, which may comprise a logical low signal, e.g., a zero "0", will be selected by the selection unit 125A. The output R3 of selection unit 125A is thus provided as an input to the respective reset (R) port of flip-flops 121A-121D.

In one example, both of groups 110A and 120A are configurable, or programmable to ignore RST1. For instance, another selection unit 115A may have a configuration or management signal RST1_IGNORE2 which causes the selection unit 115A to choose from among RST1 and a logical low signal to provide output R4. In this way, even greater flexibility is provided where both of groups 110A and 120A may be separately configurable, or programmable to ignore the control signal RST1.

Turning to set B, groups 110B and 120B are similar to groups 110A and 120A, but have a different clock signal (CLK2). As shown in FIG. 1, flip-flops 111E-111H in group 110B share a common clock enable signal (CE3), while flip-flops 121E-121H in group 120B share a different common clock enable (CE4). Alternatively, groups 110B and 120B may both share a single clock enable signal. As also shown in FIG. 1, flip-flops 111E-111H in group 110B share a common reset signal (RST2). In addition, flip-flops 121E-121H in group 120B may also be controlled by RST2. Thus, flip-flops 121E-121H also share the common reset signal (RST2). However, group 120B may also be configured, or programmed to ignore, block and/or disable the RST2 signal. In particular, for group 120B, circuit 100 further comprises a selection unit 125B, e.g., a multiplexer for selecting among RST2 and a logical low, or ground signal to provide output R1. Notably, selection unit 125B may have the same or similar functions to selection units 115A and 125A described above. For example, a configuration or management signal "reset ignore" (RST2_IGNORE1) provides a signal to the selection unit 125B to choose which of the two inputs to pass as an output R1. For instance, if RST2_IGNORE1 is a logical low, e.g., a zero "0", then the selection unit 125B may select RST2. On the other hand if RST2_IGNORE1 is a logical high, e.g., a one "1", then the ground signal, which may comprise a logical low signal, e.g., a zero "0", will be selected by the selection unit 125B. The output of selection unit 125B thus is provided as the input to the respective reset (R) port of flip-flops 121E-121H.

In one example, both of groups 110B and 120B are configurable, or programmable to ignore RST2. For example, another selection unit 115B may have a configuration or management signal RST2_IGNORE2 which causes the selection unit 115B to choose from among RST2 and a logical low signal to provide output R2. In this way, even greater flexibility is provided where both of groups 110B and 120B may be separately configurable, or programmable to ignore the control signal RST2.

Circuit 100 may also include a configuration memory to store instructions for the use of one or more reset ignore signals (e.g., RST1_IGNORE1, RST1_IGNORE2, RST2_IGNORE1 and RST2_IGNORE2). For example, circuit 100 may comprise a component of a programmable IC. Upon initialization, the programmable IC may load instructions from a configuration memory to program a large number of components within the IC. Thus, for example, RST1_IGNORE1 may be implemented via an instruction from a configuration memory to determine whether or not, during operation, flip-flops 121A-121D should respond to, or should ignore the RST1 signal.

In some cases, flip-flops in one or more of the groups are configured or programmed for a pipelining operation. For instance, many applications simply require one or more flip-flops to follow a previous flip-flop, without the need for any control signal. Accordingly, any one or more of groups 110A, 120A, 110B and 120B may be programmed (e.g., through a reset ignore signal) such that flip-flops in the group can be used for pipelining. For instance, each of the flip-flops in the group may receive a data input from the data input port (D) or the bypass input port (B) and operate without the use of the reset signal.

By allowing certain groups of flip-flops from a larger set of flip-flops to ignore, block and/or disable a control signal, e.g., the reset signal or the clock enable signal, circuit 100 provides a level of control granularity that provides for advantageous use of circuit resources, while at the same time economizing circuit space, cost and ease of production. For instance, to provide full flexibility (e.g., each flip-flop individually controllable with unique control signals as compared to the other flip-flops) requires a large amount of circuit space. For example, many separate control lines may be necessary, potentially leading to a larger circuit and a higher cost. On the other extreme, the circuit may also be designed such that all flip-flops must share the same control signals. However, if the logic design of a program requires flip-flops with different control signals, then flip-flops within the same circuit cannot be used. Rather, one or more additional circuits are required having different flip-flops that can be controlled with different control signals. In other words, many flip-flops from the first circuit may be wasted. In contrast, the present disclosure provides an optimal balance between function and economy by providing the option for only a portion (broadly a subset) of the flip-flops in a circuit to ignore a control signal (e.g., a reset signal).

Figure 2:
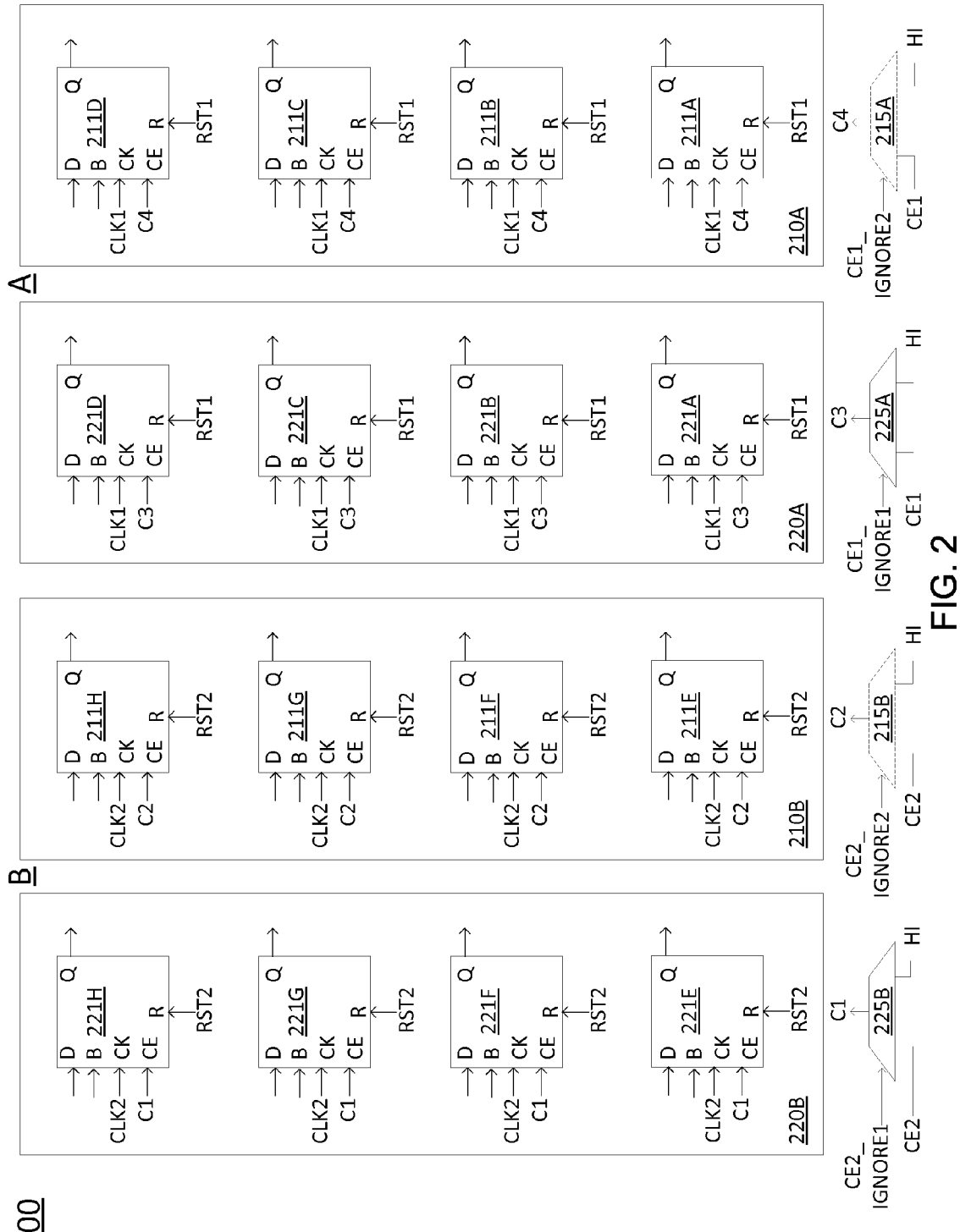
FIG. 2 illustrates a block diagram of an additional integrated circuit.

FIG. 2 illustrates another exemplary circuit 200. In the previous example of FIG. 1, different groups of flip-flops are configurable, or programmable to ignore reset signals, e.g., RST1 and RST 2. As shown in FIG. 2, different groups of flip-flops are programmable to ignore clock enable signals. For example, circuit 200 may comprise a FPGA slice, a portion of a dedicated IC, and so forth. As shown in FIG. 2, circuit 200 includes a number of groups of flip-flops, e.g., D flip-flops. Circuit 200 includes four groups 210A, 220A, 210B and 220B. However, more or less groups of flip-flops may be provided. In addition, one or more of the groups may be configured as latches. For example, flip-flop 221A may continue to function as a D flip-flop while flip-flop 211A may instead be configured to function as a latch. The flip-flops in each of the groups may comprise positive or negative edge triggered flip-flops. Similarly, the flip-flops in each of the groups may comprise different types of flip-flops, e.g., J-K flip-flops, SR flip-flops, or other types of flip-flops.

The groups are further organized into larger sets "A" and "B". As shown in FIG. 2, sets "A" and "B" have independent clock signals. For example, groups 210A and 220A in set "A" share clock 1 (CLK1), while groups 210B and 220B in set "B" share clock 2 (CLK2). Within each of the groups are a number of flip-flops. In FIG. 2, each group has four flip-flops. For instance, group 210A includes flip-flops 211A-211D, group 220A includes flip-flops 221A-221D, group 210B includes flip-flops 211E-211H, and group 220B includes flip-flops 221E-221H. More or less flop-flops may be included within each group. In addition, each of the groups may include a same number of flip-flops or different groups may have different numbers of flip-flops.

Turning to set A as an example, both groups 210A and 220A share a common clock signal CLK1. As shown in FIG. 2, the flip-flops 211A-211D and 221A-221D in groups 210A and 220A, respectively share a single common reset signal (RST1). However, in another example, each of the flop-flops 211A-211D in group 210A share a common reset signal, while each of the flip-flops 221A-221D in group 220A share a different common reset signal. As also shown in FIG. 2, flip-flops 211A-211D in group 210A share a common clock enable signal (CE1). In addition, flip-flops 221A-221D in group 220A may also be controlled by CE1. Thus, flip-flops 221A-221D also share the common clock enable signal (CE1). However, group 220A may also be configured, or programmed to ignore the CE1 signal. In particular, for group 220A, circuit 200 further comprises a selection unit 225A, e.g., a multiplexer for selecting among CE1 and a logical high signal to provide an output C3. For example, a configuration or management signal for "clock enable ignore", (CE1_IGNORE1), provides a signal to the selection unit 225A to choose which of the two inputs to pass as an output C3. For instance, if CE1_IGNORE1 is a logical low, e.g., a zero "0", then the selection unit 225A may select CE1. On the other hand, if CE1_IGNORE1 is a logical high, e.g., a one "1", then the high signal, which may comprise a logical one "1", will be selected by the selection unit 225A. The output of selection unit 225A thus is provided as the input to the respective clock enable (CE) port of flip-flops 221A-221D.

In one example, both of groups 210A and 220A are configurable, or programmable to ignore CE1. For instance, another selection unit 215A may have a configuration or management signal CE1_IGNORE2 which causes the selection unit 215A to choose from among CE1 and a logical high signal to provide the output C4. In this way, even greater flexibility is provided where both of groups 210A and 220A may be separately configurable, or programmable to ignore the control signal CE1.

Turning to set B, groups 210B and 220B are similar to groups 210A and 220A, but have a different clock signal (CLK2). As shown in FIG. 2, the flip-flops 211E-211H and 221E-221H in groups 210B and 220B, respectively share a single common reset signal (RST2). However, in another example the flop-flops 211E-211H in group 210B may share a common reset signal, while the flip-flops 221E-221H in group 220B share a different common reset signal. As also shown in FIG. 2, flip-flops 211E-211H in group 210B share a common clock enable signal (CE2). In addition, flip-flops 221E-221H in group 220B may also be controlled by CE2. Thus, flip-flops 221E-221H also share the common clock enable signal (CE2). However, group 220B may also be configured, or programmed to ignore the CE2 signal. In particular, for group 220B, circuit 200 further comprises a selection unit 225B, e.g., a multiplexer for selecting among CE2 and a logical high signal to provide the output C1. Notably, selection unit 225B may have the same or similar functions to selection units 215A and 225A described above. For example, another configuration or management signal for "clock enable ignore", (CE2_IGNORE1), provides a signal to the selection unit 225B to choose which of the two inputs to pass as an output. For instance, if CE2_IGNORE1 is a logical low, e.g., a zero "0", then the selection unit 225B may select CE2. On the other hand, if RST2_IGNORE1 is a logical high, e.g., a one "1", then the logical high signal, e.g., a one "1", will be selected by the selection unit 225B. The output of selection unit 225B thus is provided as the input to the respective clock enable (CE) port of flip-flops 221E-221H.

In one example, both of groups 210B and 220B are configurable, or programmable to ignore CE2. For instance, another selection unit 215B may have a configuration or management signal CE2_IGNORE2 which causes the selection unit 215B to choose from among CE2 and a logical high signal to provide the output C2. In this way, even greater flexibility is provided where both of groups 210B and 220B may be separately configurable, or programmable to ignore the control signal CE2.

Circuit 200 may also comprise a configuration memory to store instructions as to the use of one or more clock enable ignore signals (e.g., CE1_IGNORE1, CE1_IGNORE2, CE2_IGNORE1 and CE2_IGNORE2). For example, circuit 200 may comprise a component of a programmable IC. Upon initialization, the programmable IC may load instructions from a configuration memory to program a large number of components within the IC. Thus, for example, CE1_IGNORE1 may be implemented via an instruction from a configuration memory to determine whether or not, during operation, flip-flops 221A-221D should respond to, or should ignore, block and/or disable the CE1 signal.

In some cases, flip-flops in one or more of the groups are configured or programmed for a pipelining operation, e.g., through a clock enable ignore signal. For instance, each of the flip-flops in a group may receive a data input from the data input port (D) or the bypass input port (B) and operate without the use of a clock enable signal.

Figure 3:
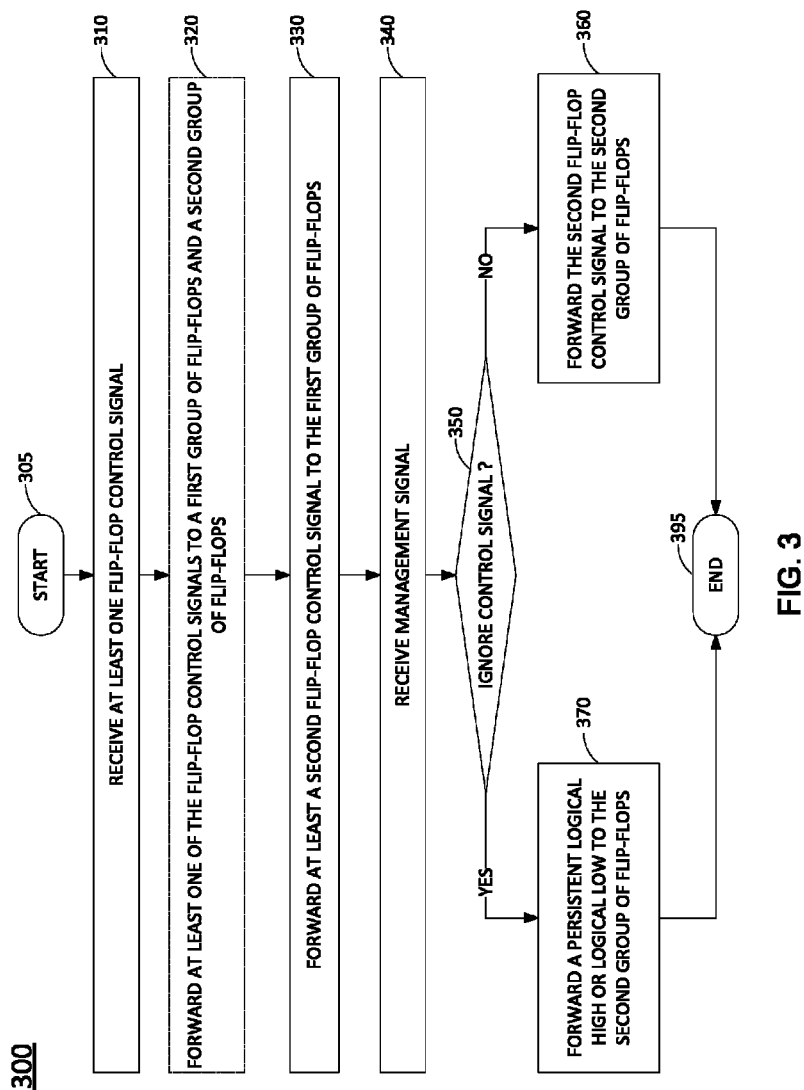
FIG. 3 illustrates a block diagram of a method for managing, operating and/or programming an integrated circuit.

FIG. 3 illustrates a block diagram of a method 400 for managing, operating and/or programming an integrated circuit. For example, method 300 can be performed by a circuit/device according to any one or more of the above described circuits. In one example, a computer-readable medium according to the present disclosure stores a series of instructions which cause a programmable device, or circuit to be programmed to perform the steps, functions operations of the method 300. The method starts in step 305 and proceeds to step 310.

In step 310, a circuit receives at least one flip-flop control signal. For example, the circuit may receive a clock enable signal and/or a reset signal. At step 310, the circuit may further receive an additional control signal, e.g., at least one clock signal. In a different example, the circuit receives two clock signals.

At optional step 320, the circuit forwards at least one of the flip-flop control signals to a first group of flip-flops and to a second group of flip-flops. For example, the method may forward the clock enable signal to both the first and second group of flip-flops. In another example, the circuit forwards the reset signal to both the first and second group of flip-flops.

At step 330, the circuit forwards at least a second of the flip-flop control signals to the first group of flip-flops. For example, if at step 320, the circuit forwards the clock enable signal to both the first and second group of flip-flops, then at step 330, the circuit forwards the reset signal only to the first group of flip-flops. Similarly, if at step 320, the circuit forwards the reset signal to both the first and second group of flip-flops, then at step 330, the circuit forwards the clock enable signal only to the first group of flip-flops. In cases where step 320 is omitted, step 330 may comprise either forwarding the clock enable signal or forwarding the reset signal.

At step 340, the circuit receives a management signal, e.g., an ignore signal that indicates whether or not a control signal should be ignored for the second group of flop-flops. For instance, the circuit may receive an instruction from a configuration memory that indicates whether the second of the flip-flop control signals should be ignored or blocked to the second group of flip-flops.

At step 350, the circuit determines whether or not the second of the flip-flop control signals should be ignored. For example, if the ignore signal comprises a zero, then the circuit may determine to not block, or to allow the second control signal to reach the second group of flop-flops. In this case, following step 350 the method proceeds to step 360. On the other hand, if the ignore signal comprises a one, then the circuit determines to block or to disallow the second control signal from reaching the second group of flop-flops. In this case, following step 350 the method proceeds to step 370. In one embodiment, step 350 is performed via a selection unit of the circuit, e.g., a multiplexer.

At step 360, the circuit forwards the second flip-flop control signal to the second group of flip-flops. For example, for a particular circuit application, it may be desirable for flip-flops in both the first group and the second group to share both the first and second control signals.

On the other hand, if the ignore signal is determined to be valid, e.g., is a one, at step 350, then the method proceeds from step 350 to step 370. At step 370, the circuit forwards a persistent logical high or logical low to the second group of flip-flops instead of the second flip-flop control signal. For example, if the second flip-flop control signal comprises a clock enable signal, the circuit may forward the logical high signal. On the other hand, when the second control signal comprises a reset signal, the method forwards the logical low signal. For example, the logical low signal may be provided by a connection to ground and the logical high signal may be provided by a connection to an on-chip or off-chip voltage source. In one embodiment, step 370 is performed via a selection unit of the circuit, e.g., a multiplexer.

Following step 360 or step 370, the method proceeds to step 395 where the method ends. Advantageously, the present method 300 provides for selectively ignoring/blocking or allowing a control signal for a selected group of flip-flops within a set of flip-flops. By providing for certain groups of flip-flops from a larger set of flip-flops to selectively ignore, block and/or disable a control signal, the method 300 provides a level of control granularity that allows for advantageous use of circuit resources.

It should be noted that although not specifically specified, one or more steps, functions and/or operations of the method 300 may include a storing, displaying and/or outputting step as required for a particular application. In other words, any data, records, fields, tables, and/or intermediate results discussed in the method can be stored, displayed and/or outputted to another device as required for a particular application. Furthermore, steps, operations, or blocks in FIG. 3 that recite a determining operation or involve a decision, do not necessarily require that both branches of the determining operation be practiced. In other words, one of the branches of the determining operation can be deemed as an optional step. In addition, although the steps/functions/operations of method 300 are listed in a particular order, it should be noted that in other, further and different examples of the present disclosure, any one or more of the steps of method 300 may be performed in a different order, or even performed at the same time.

Figure 4:
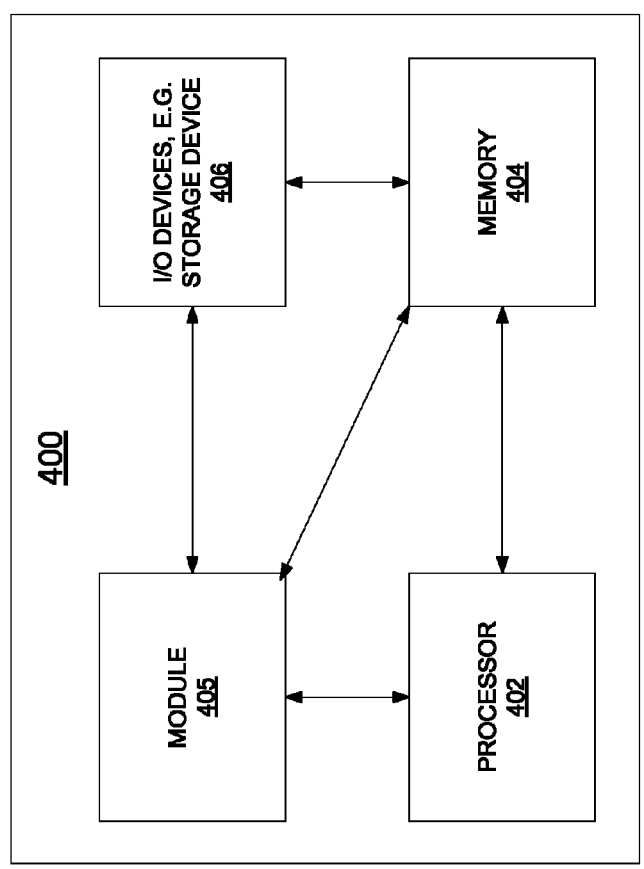
FIG. 4 illustrates a high level block diagram of a general purpose computer or a computing device suitable for use in performing the functions described herein.

FIG. 4 depicts a high level block diagram of a general purpose computer, a computing device, or a computing system 400 suitable for use in performing some or all of the functions described herein. As depicted in FIG. 4, the system 400 comprises a processor element 402 (e.g., a microprocessor, a central processing unit (CPU) and the like), a memory 404 (e.g., random access memory (RAM), read only memory (ROM) a disk drive, an optical drive, a magnetic drive, and/or a Universal Serial Bus (USB) drive), a module 405 for managing/programming an integrated circuit, and various input/output devices 406 (e.g., storage devices, including but not limited to, a tape drive, a floppy drive, a hard disk drive or a compact disk drive, a receiver, a transmitter, a speaker, a display, a speech synthesizer, an output port, and/or a user input device (such as a keyboard, a keypad, a mouse, and the like)).

It should be noted that the present disclosure can be implemented in software and/or in a combination of software and hardware, e.g., using application specific integrated circuits (ASIC), programmable ICs, a PLD such as an FPGA, a general purpose computer or any other hardware equivalents such as microprocessors. For example, computer readable instructions pertaining to the method discussed above can be used to configure a hardware processor to perform the steps, functions and/or operations of the above disclosed method. Thus, in one example the present module or process 405 can be loaded into memory 404 and executed by processor 402 to configure an integrated circuit to perform the functions as discussed above. As such, the present module or process 405 (including associated data structures) can be stored on a non-transitory computer readable storage medium, e.g., RAM memory, magnetic or optical drive or diskette and the like.

The exemplary methods and apparatuses may also be implemented in whole or in part by a programmable IC, e.g., a PLD and/or FPGA. A PLD is a general-purpose device that can be programmed by a user to implement a variety of selected functions. One type of PLD is a Field Programmable Gate Array (FPGA), which typically includes an array of configurable logic blocks (CLBs) and a plurality of input/output blocks (IOBs). The CLBs are individually programmable and can be configured to perform a variety of logic functions on a few input signals. The IOBs can be configured to drive output signals from the CLBs to external pins of the FPGA and/or to receive input signals from the external FPGA pins. The FPGA also includes a programmable interconnect structure that can be programmed to selectively route signals among the various CLBs and IOBs to produce more complex functions of many input signals. The CLBs, IOBs, and the programmable interconnect structure are programmed by loading configuration data into associated memory cells that control various switches and multiplexers within the CLBs, IOBs, and the interconnect structure to implement logic and routing functions specified by the configuration data to implement a user design in the FPGA. An FPGA may also include other programmable and non-programmable resources. As such, the steps, functions and/or operations shown above in connection with the method of FIG. 3 may be implemented in one or more CLBs that perform equivalent logic operations. For example, the method 300 may provide a programmable IC in which the steps of 310-370 are configuring steps that are applied to the IC to form the various structures as discussed in FIGS. 1-2. Similarly, the circuits shown above in connection with FIGS. 1 and 2 may comprise components of any one or more CLBs, e.g., a slice of an FPGA, and the like. Accordingly, the method of FIG. 3 may comprise computer-readable/computer-executable instructions loaded from the memory cells to configure/program an integrated circuit such as shown in FIGS. 1 and 2 above.

While the foregoing describes illustrative examples in accordance with one or more aspects of the present invention, other and further embodiment(s) in accordance with the one or more aspects of the present invention may be devised without departing from the scope thereof, which is determined by the claim(s) that follow and equivalents thereof. Claim(s) listing steps do not imply any order of the steps. Trademarks are the property of their respective owners.

What is claimed is:

1. An integrated circuit, comprising:
    a first group of flip-flops;
    a second group of flip-flops, wherein the flip-flops in the first group and the flip-flops in the second group share a common reset signal; and
    a first selection unit for selecting a first output from among the common reset signal and a logical low signal to be sent to the second group of flop-flops;
    wherein a selection of the logical low signal is for preventing the common reset signal from being applied to the flip-flops in the second group.

2. The integrated circuit of claim 1, wherein the first selection unit is further for selecting the first output based upon a reset ignore signal.

3. The integrated circuit of claim 1, wherein the first group and the second group comprises a same number of flip-flops.

4. The integrated circuit of claim 1, wherein the flip-flops in the first group share a first common clock enable signal and the flip-flops in the second group share a second common clock enable signal.

5. The integrated circuit of claim 1, wherein the flip-flops in the first group and the flip-flops in the second group share a common clock enable signal.

6. The integrated circuit of claim 1, wherein the flip-flops in the first group and the flip-flops in the second group share a common clock signal.

7. The integrated circuit of claim 1, further comprising:
    a second selection unit for selecting a second output from among the common reset signal and a logical low signal to be sent to the first group of flop-flops;
    wherein a selection of the logical low signal is for preventing the common reset signal from being applied to the flip-flops in the first group.

8. The integrated circuit of claim 1, further comprising a plurality of look-up tables.

9. The integrated circuit of claim 8, wherein each of the flip-flops in the first group and each of the flip-flops in the second group has at least one input port for receiving at least one input from at least one of the plurality of look-up tables.

10. The integrated circuit of claim 1, further comprising a configuration memory.

11. The integrated circuit of claim 10, wherein the first selection unit is further for selecting the first output based upon a reset ignore signal stored in the configuration memory.

12. The integrated circuit of claim 1, wherein the first group and the second group comprise components of a slice of the integrated circuit.

13. The integrated circuit of claim 1, wherein the integrated circuit is a field-programmable gate array.

14. An integrated circuit, comprising:
    a first group of flip-flops;
    a second group of flip-flops, wherein the flip-flops in the first group and the flip-flops in the second group share a common clock enable signal; and
    a first selection unit for selecting a first output from among the common clock enable signal and a logical high signal to be sent to the second group of flip-flops;
    wherein a selection of the logical high signal is for preventing the common clock enable signal from being applied to the flip-flops in the second group.

15. The integrated circuit of claim 14, wherein the first selection unit is further for selecting the first output based upon a clock enable ignore signal.

16. The integrated circuit of claim 14, wherein the flip-flops in the first group share a first common reset signal and the flip-flops in the second group share a second common reset signal.

17. The integrated circuit of claim 14, wherein the flip-flops in the first group and the flip-flops in the second group share a common reset signal.

18. The integrated circuit of claim 14, wherein the flip-flops in the first group and the flip-flops in the second group share a common clock signal.

19. The integrated circuit of claim 14, further comprising:
a second selection unit for selecting a second output from among the common clock enable signal and a logical high signal to be sent to the first group of flop-flops;
wherein a selection of the logical high signal is for preventing the common clock enable signal from being applied to the flip-flops in the first group.

20. An integrated circuit, comprising:
a first group of flip-flops;
a second group of flip-flops; and
a selection unit,
wherein the selection unit is controllable to disable one of a clock enable signal or a reset signal to the second group of flip-flops; and
wherein the clock enable signal or the reset signal is shared by the first group of flip-flops and the second group of flip-flops.

* * * * *